United States Patent [19]
Dallabora et al.

[11] Patent Number: 5,638,327
[45] Date of Patent: Jun. 10, 1997

[54] FLASH-EEPROM MEMORY ARRAY AND METHOD FOR BIASING THE SAME

[75] Inventors: Marco Dallabora, Carpiano; Mauro L. Sali, S. Angelo Lodigiano; Fabio Tassan Caser, Milan; Corrado Villa, Sovico, all of Italy

[73] Assignee: SGS-Thomson Microelectronics S.r.l., Agrate-Brianza, Italy

[21] Appl. No.: 412,162

[22] Filed: Mar. 28, 1995

[30] Foreign Application Priority Data

Mar. 28, 1994 [EP] European Pat. Off. ............. 94830144

[51] Int. Cl.$^6$ .................................. G11C 16/00
[52] U.S. Cl. ....................... 365/185.33; 365/185.18; 365/185.28; 365/185.29; 365/104
[58] Field of Search ................... 365/185.33, 185.18, 365/185.28, 185.29, 185.26, 185.05, 185.1, 103, 104

[56] References Cited

U.S. PATENT DOCUMENTS

| | | | |
|---|---|---|---|
| 4,698,787 | 10/1987 | Mukherjee et al. | 365/185 |
| 4,763,299 | 8/1988 | Hazani | 365/185.05 |
| 4,794,565 | 12/1988 | Wu et al. | 365/185 |
| 4,868,619 | 9/1989 | Mukherjee et al. | 357/23.5 |
| 5,103,425 | 4/1992 | Kuo et al. | 365/104 |
| 5,303,184 | 4/1994 | Noda | 365/104 |
| 5,321,288 | 6/1994 | Gill et al. | 365/185.18 |
| 5,394,360 | 2/1995 | Fukumoto | 365/185.26 |
| 5,563,842 | 10/1996 | Challa | 365/230.06 |

FOREIGN PATENT DOCUMENTS

| | | | |
|---|---|---|---|
| 0477938 | 4/1992 | European Pat. Off. | G11C 16/04 |
| 0530644 | 3/1993 | European Pat. Off. | H01L 29/788 |
| 2235999 | 3/1991 | United Kingdom | G11C 16/06 |

OTHER PUBLICATIONS

Stiegler et al., "A 4Mb 5V—Only Flash EEPROM With Sector Erase," in *1990 Symposium on VLSI Circuits Digest of Technical Papers*, Honolulu, HI, Jun. 7–9, 1990, pp. 103–104.

Fukuda et al., "A 55ns 64Kx16b CMOS EPROM," in *IEEE International Solid-State Conference*, Feb. 18, 1988, pp. 122–123.

Nakamura et al., "A 55ns 4Mb EPROM with 1–Second Programming Time," *IEEE International Solid-State Circuits Conference*, Feb. 14, 1990, pp. 62–63.

Amin, "Speed optimised array architecture for flash EEPROMs," *IEE Proceedings-G*, 140(3):177–181 1993.

*Primary Examiner*—Tan T. Nguyen
*Attorney, Agent, or Firm*—David V. Carlson; Harry K. Ahn; Seed and Berry LLP

[57] ABSTRACT

A flash-EEPROM memory array presenting a NOR architecture wherein the memory cells, organized in rows and columns and having drain regions connected to respective bit lines, source regions connected to a common source line, and control gate regions connected to respective word lines, present an asymmetrical structure wherein one of the source and drain regions presents a highly resistive portion to permit programming and erasing of the cells at different regions. The array includes bias transistors arranged in a row and each connected between a respective bit line and the common source line, for maintaining at the same potential the drain and source regions of the cells connected to the nonaddressed bit lines during programming, and so preventing spurious writing.

23 Claims, 1 Drawing Sheet

FLASH-EEPROM MEMORY ARRAY AND METHOD FOR BIASING THE SAME

TECHNICAL FIELD

The present invention relates generally to electronic devices and more specifically to a flash-EEPROM memory array and a method for biasing the array.

BACKGROUND OF THE INVENTION

Nonvolatile memories have progressed rapidly from read-only to electrically erasable programmable read-only memories or EEPROMs. Of these, great interest is currently being shown in the flash type, the cells of which are based on a stacked gate structure, and are programmed (written) by channel hot electron injection at the drain region, and erased by Fowler-Nordheim tunneling.

Flash memories, like other nonvolatile memories, may be variously organized according to a row and column cell arrangement wherein the cells in the same row are connected at the control gate terminal to the same word line, and the cells in the same column are connected at the drain terminal to the same bit line. In one known configuration, known as NOR architecture, the source terminals of at least part of the array are connected to a common source line, so that each bit line sees the cells connected to it in a parallel configuration, i.e., a NOR connection.

At present, flash memories are read/programmed byte by byte or word by word, and are erased globally (full chip erase) or partially by a particular portion of the overall array (sector erase). Although most present-generation flash-memory devices employ a dual-voltage power supply, typically $V_{CC}=5$ V and $V_{pp}=12$ V, several single-power-supply devices are available. Standard flash memories of the above types cannot operate with a supply voltage $V_{CC}$ of less than 5 V due to the high programming current required.

To reduce the programming current, new cell structures have been proposed which, as opposed to drain-side injection as in standard cells, provide for source-side injection (SSI) hot electron programming. These new cell structures have aroused considerable interest by permitting programming of the cells with a lower current as compared with that used to program standard cells, and by enhancing programming efficiency by approximately one order of magnitude.

One example of an SSI programming structure is described in U.S. Pat. No. 4,794,565, which issued on 27 Dec. 1988, and comprises asymmetrical drain and source regions. More specifically, a highly resistive region is provided close to the source region, so that its conductivity is not easily modulated by the control gate voltage; and programming is based on bringing the high lateral electric field in the silicon from the drain to the source where the vertical field in the oxide is highest.

Ideally, there should be no current flow between the drain and source regions during programming. In actual practice, however, this current is not eliminated entirely, but is considerably lower with respect to the standard structure.

Other structures have also been proposed to improve the above basic concept. One such cell is described, for example, in EP-A-0 530 644 filed on 25 Aug. 1992 (priority 30 Aug. 1991) by Texas Instruments, and in an article entitled "Buried Source-Side Injection (BSSI) for Flash EPROM Programming" by Cetin Kaya, David K. Y. Liu, Jim Paterson, Pradeep Shah, IEEE Electron Device Letters, Vol. 13, No. 9, September 1992, and is based on the presence of a low-doped region implanted deeply in the channel region, adjacent to the source region, and, therefore, beneath the floating gate region, but separated from the surface of the substrate.

BSSI or SSI cells are programmed by grounding the source terminal, and applying a high voltage (10–13 V) to the gate terminal and a lower voltage (3–3.5 V) to the drain terminal, so that the applied electric field produces electron flow from the low-doped region to the surface of the substrate. The electrons, accelerated by the high field value, travel through the gate oxide and are trapped in the floating gate region, thus writing the cell.

SSI or BSSI cells are erased by applying a high negative voltage (–10 V) to the control gate terminal and a low voltage (4–6 V) to the drain terminal (with a floating source terminal) to produce electron flow from the floating gate to the drain region. As such, programming and erasing are performed at different regions (source for programming, drain for erasing).

SSI or BSSI cells are read by inverting the drain and source terminal bias with respect to standard cells, to achieve a sufficient read current, and by applying a high voltage (supply voltage $V_{CC}$ of, say, 5 V) to the gate terminal, a low voltage (1–2 V) to the source terminal, and grounding the drain terminal.

SUMMARY OF THE INVENTION

It is an object of the present invention to provide a NOR flash type memory array that provides for low current and high programming efficiency without modifying auxiliary elements such as decoding, sensing and load devices.

In accordance with one aspect of the present invention, a nonvolatile memory device includes one or more bit lines, common source lines, word lines, and memory cells. Each memory cell includes a source coupled to a common source line. A drain that is asymmetrical with respect to the source is coupled to a bit line, and a control gate coupled to a word line. A floating gate is disposed between the control gate and the drain and source, and a resistive programming region composes a portion of either the drain or the source.

The memory device may also include one or more bias lines and bias switches. Each bias switch has a first terminal coupled to a bit line, a second terminal coupled to a common source line, and a control terminal coupled to a bias line, which may run parallel to the word lines.

In accordance with another aspect of the invention, an addressed cell is programmed by a write current that is generated between the floating gate and the resistive region. The write current may be generated by biasing the addressed word line to a first voltage level and biasing an addressed bit line to a second voltage level. A selected cell or a selected block of cells are erased by an erase current that is generated between the floating gate and whichever of the drain and source that does not include the resistive region.

In preparation of programming, the common source lines and the unaddressed bit lines may be biased to a first voltage level before the addressed word line is biased. This procedure aids in preventing any spurious writing of unaddressed memory cells.

BRIEF DESCRIPTION OF THE DRAWINGS

A preferred non-limiting embodiment of the present invention will be described by way of example with reference to the accompanying drawings, in which.

DETAILED DESCRIPTION OF THE INVENTION

Figure 1:
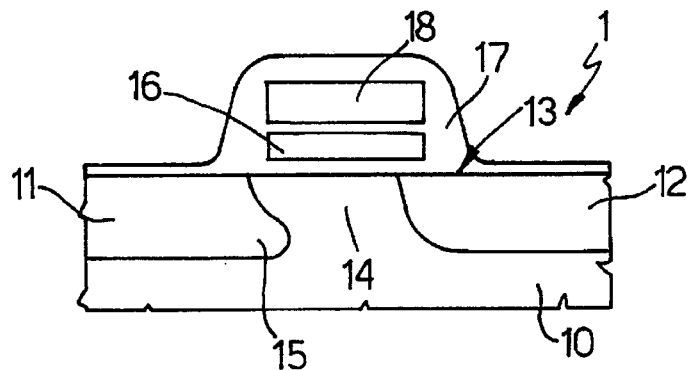
FIG. 1 shows a deep-implanted asymmetrical cell.

FIG. 1 illustrates a deep-implanted asymmetrical cell 1 as described in the aforementioned Patent Application EP-A-O 530 644. Cell 1 includes a substrate 10 having highly doped regions 11 and 12 adjacent surface 13 of the substrate 10. According to the above European patent application, regions 11 and 12 are respectively source and drain regions separated by a channel 14; source region 11 comprises a low-doped portion 15 (high resistivity region); over channel 14, there is provided a floating gate region 16 fully embedded in a dielectric layer 17; over region 16, there is provided a control gate region 18 connected to a word line (not shown) of the memory array of which cell 1 forms a portion; and floating gate region 16 extends over part of drain region 12 and over low-doped portion 15, but does not extend over the remaining (highly doped) portion of source region 11.

As indicated above, BSSI cell 1 is biased so as to generate a high voltage (in one embodiment of the invention, from 4 V to 8 V) between the tip of the low-doped region 15 and surface 13 of the substrate, and produce a flow of electrons, which are energized by the high field, from the tip to the surface 13.

Figure 2:
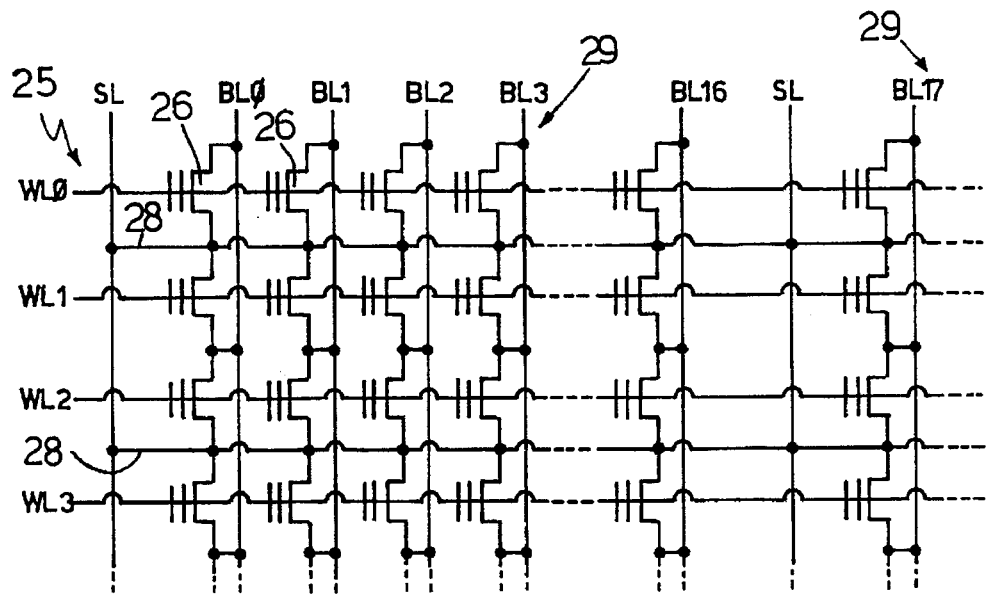
FIG. 2 shows the architecture of a memory array having a standard NOR configuration.

FIG. 2 shows a memory array 25 having a standard NOR configuration, and comprising a number of cells 26 arranged in rows and columns and divided into sectors, each sector comprising a predetermined number of local or global decoding columns, for example, 256. The cells 26 in the same row in each sector present the gate regions connected to the same word line WL0–WL3, . . . , and the cells 26 in the same column in each sector present the drain regions connected to the same bit line BL0–BL3, . . . , BL16, BL17, . . . . The bit lines of some or all the sectors may be formed by one continuous line or divided into a number of segments. The source regions of cells 26 in each row of the sector are coupled by a source line 28 common to each two adjacent rows. For each sector, a number of common source lines SL are provided extending parallel to the bit lines, for example, one every 16 bit lines, and coupled to source lines 28, so that all the cells in the same sector have their source regions coupled to one another. Common source lines SL define subsectors 29, which, in one example, each comprise sixteen columns (bit lines), and are grounded or coupled to a power supply voltage by a pair of switches (not shown) forming part of the external circuitry of the memory array and controlled alternately in different operating modes of the memory.

Figure 3:
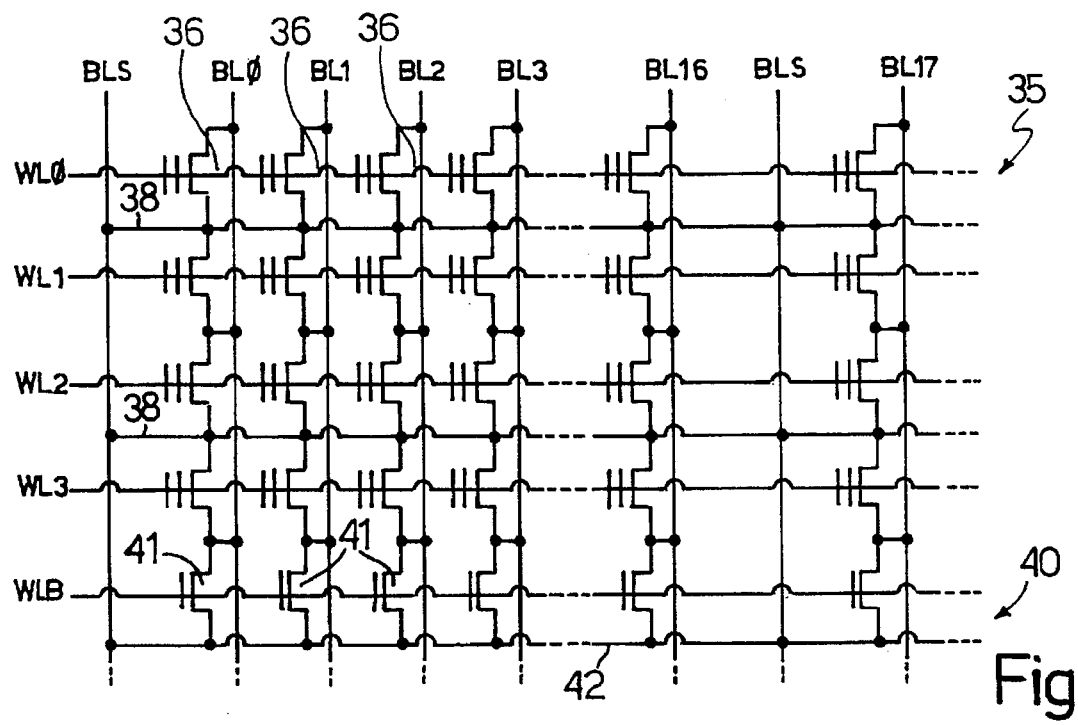
FIG. 3 shows the architecture of a memory array according to the present invention.

FIG. 3 shows a NOR memory array 35 in accordance with the present invention. Array 35 includes a number of cells 36 arranged in rows and columns and organized in sectors, so that cells 36 in the same column in each sector present the drain terminal connected to the same bit line BL0–BL3, . . . , BL16, BL17; . . . , and cells 36 in the same row in each sector present the gate terminal connected to the same word line WL0–WL3, . . . . The source terminals of cells 36 in the same row are connected to the same source line 38 common to each pair of adjacent rows in the array; and source lines 38 are connected to common source lines BLS extending parallel to the bit lines, for example, one common source line BLS every sixteen bit lines.

Cells 36 are asymmetrical, the source or drain region of which presents an implanted, preferably deep-implanted, portion for exploiting the two-sided cell programming and erasing principle. Cells 36 may present any known structure of the type indicated, for example, the structure shown in FIG. 1.

Array 35 includes one or more bias rows for appropriately biasing the bit lines in different operating modes (erase, write, read). More specifically, FIG. 3 shows a bias row 40 formed by a number of MOS transistors 41 with the gate terminals connected to a bias word line WLB, the drain terminals connected to the respective bit line BL0–BL3, . . . , BL16, BL17, . . . , and the source terminals connected to a respective source line 42 similar to source lines 38.

Transistors 41 are of the same type as the memory cells (in one embodiment, N-channel), are designed for high conductivity, and may also be asymmetrical with different drain and source regions.

A description is now given of one manner in which array 35 may be read, programmed and erased according to the present biasing method. In the example described, the low-doped deep region is formed at the drain region (i.e., the region connected to the bit line).

READ MODE

Reading is performed by applying a positive voltage (≈2 V) to the bit line to which the cell to be read is connected (addressed bit line), applying supply voltage $V_{CC}$ to the word line to which the cell to be read is connected (addressed word line), and grounding the common source line BLS. The bias word line WLB may be biased to the supply voltage or grounded. The other (nonaddressed) word lines are grounded, and the other (nonaddressed) bit lines are left floating. As discussed below, the current drawn by a transistor 41 that is biased "on" (i.e., WLB at the supply voltage) is small enough so as to not cause a false reading on the corresponding bit line BL.

The addressed cell is thus read in conventional manner as in known generation memories.

Biasing of the cells connected to nonaddressed bit lines, on the other hand, depends on the bias of bias word line WLB. More specifically, if WLB is grounded, bias transistors 41 are off and the nonaddressed bit lines are floating, so that the bit lines (if formerly biased for example to the read voltage) are gradually grounded due to inherent losses. Conversely, if line WLB is connected to $V_{CC}$, bias transistors 41 are on and connect the nonaddressed bit lines to common source lines BLS, so that the nonaddressed bit lines are grounded rapidly and safely. This is useful in certain situations, for example, when noise is a problem and definite voltage levels are required, or for ensuring a reset situation.

In the "on" or operating condition, each of bias transistors 41 conducts a current of no more than approximately 1 μA, which may be achieved by adjusting the bias voltage on bias word line WLB or on the characteristics of the transistors, more specifically by appropriately selecting their $V_T$ and $g_m$ values.

PROGRAMMING MODE

Programming is performed by inverting the addressed cell bias with respect to read mode, and applying the different bias voltages according to a predetermined sequence.

More specifically, the word line connected to the cell for writing (programming) is brought to high voltage (10–13 V); the bit line connected to the cell for writing is grounded; and the common source line BLS is brought to an intermediate voltage (4–6 V). As such, the addressed cell may be written via the drain region with low drain-source current and high efficiency.

The low biasing current (approximately 10–100 μA) required by the above biasing method poses no problems as regards formation and sizing of the program load line (not shown), so that the current driven onto each of the bit lines by bias transistors 41 is in the order of 10–30 µA, which value is achieved by virtue of the geometry of transistors 41, if asymmetrical like cells 36, or else by appropriate design choices. In one embodiment of the invention, the program load line is the switching means that couples the selected bit line to ground during the programming mode. (While in the read mode, the selected bit line is coupled to a sense amplifier.) In some prior-art arrays, the program load line comprises a programming voltage source (an external pin or an internal charge pump) in series with the switching means that selects the desired bit line.

Such biasing, however, may possibly result in spurious writing of virgin (nonwritten) cells connected to the addressed word line and having the gate terminal biased to the high write voltage, and the source terminal connected to the same intermediate voltage as on BLS. In fact, if the bit line of even one of said cells is pre-discharged to 0 V, the bit line, being equivalent to a distributed (albeit small) capacitance, tends to charge to the voltage at the source terminal of the nonaddressed cell. This charge may produce a small displacement current which, in view of the high write efficiency of the memory array cells, results in slight writing of the nonaddressed cell with a threshold jump of a few mV. As this is repeated in successive programming cycles, the nonaddressed cell charges to higher and higher threshold values until it eventually reaches the typical threshold of a written cell, thus altering the stored data.

To prevent spurious programming of the cells, according to the biasing method of the present invention, the nonaddressed cells on the addressed row (and, in general, all the cells connected to the nonaddressed bit lines) are so biased as to present a zero potential difference between the drain and source terminals, thus preventing them from being written. Such biasing is achieved by means of bias transistors 41, which couple the nonaddressed bit lines to common source line BLS.

More specifically, for safely preventing spurious writing even only for a fraction of programming time, the intermediate voltage is first applied to common source line BLS, and bias transistors 41 are turned on by applying a high voltage (for example, 5 volts) to bias word line WLB, so that all the bit lines BL are brought to the same potential as source lines 38, and all the cells present a zero voltage drop between the source and drain. Subsequently, the addressed word line is brought to the high write voltage (10 V), and the addressed bit line is grounded (0 V) so that only the addressed cell is written. The corresponding bias transistor 41 will source approximately 10–30 µA to the addressed bit line. However, the bit-line driver (not shown) is able to sink this current, and thus maintain the addressed bit line at approximately 0 volts. Thus, the voltage on BLS appears across the transistor 41 that is coupled to the addressed bit line.

ERASE MODE

Erasing of a whole sector or the whole array is effected by applying a high negative voltage to the word lines and bringing the common source line BLS to a positive voltage derived directly from supply VCC. The drain terminal is left floating.

Erasing may be performed using any standard erase architecture or algorithm, for example, feedback resistors (not shown) at the source terminal to limit band-to-band tunnel current. Such feedback resistors are described in "An experimental approach to characterize the erasing of a flash cell in realistic condition," by R. Bez et al., presented at the 13th Annual IEEE Nonvolatile Semiconductor Memory Workshop, Monterey, Feb. 20–22, 1994.

The table below shows a summary of the above bias voltages.

TABLE I

| MODE | $BL_a$ | $BL_i$ | $WL_a$ | $WL_i$ | WLB | BLS |
|---|---|---|---|---|---|---|
| READ | 2 V | 0 V/F1 | $V_{cc}$ | 0 V | $V_{cc}$/0 V | 0 V |
| PROGRAM | 0 V | 6 V | 10 V | 0 V | 10 V | 6 V |
| ERASE | F1 | F1 | −10 V | −10 V | 0 V | 6 V |

TABLE I

In Table I, $BL_a$, $WL_a$ indicate the addressed bit and word lines; $BL_i$, $WL_i$ the nonaddressed bit and word lines; and WLB, BLS the bias word lines and common source lines shown in FIG. 3.

According to another embodiment of the present invention, the deep-implanted region (region 15 in FIG. 1) constitutes the source region, i.e., the region, in memory array 35, connected to the respective source line; and the region without the deep-implanted region (12 in FIG. 1) constitutes the drain region, i.e., the region connected to the respective bit line. As such, the erase terminal (at intermediate voltage) is the drain terminal connected to the bit lines, and the programming terminal is the source terminal.

In this case also, when programming an addressed cell, bias transistors 41 prevent the cells in the same row from being written by maintaining all the nonaddressed bit lines at the same potential as the source lines; and the biasing sequence again comprises biasing the common source line BLS to 0 V and the bias word line WLB to high voltage, biasing the addressed word line to high voltage, and, finally, biasing the addressed bit line to intermediate voltage.

Table II below shows biasing of the cells according to the above variation.

TABLE II

| MODE | $BL_a$ | $BL_i$ | $WL_a$ | $WL_i$ | WLB | BLS |
|---|---|---|---|---|---|---|
| READ | 0 V | 2 V/F1 | $V_{cc}$ | 0 V | $V_{cc}$/0 V | 2 V |
| PROGRAM | 6 V | 0 V | 10 V | 0 V | 10 V | 0 V |
| ERASE | 6 V | 6 V | −10 V | −10 V | 0 V | F1 |

TABLE II $BL_a$, $BL_i$, $WL_a$, $WL_i$, WLB and BLS in the above table have the same meaning as in Table I.

In the above embodiment, the program load line is connected conventionally to the column decoding circuitry (not shown), whereas reading requires a column load arrangement for sensing current with respect to ground instead of the supply voltage. Such column decoding circuitry, which, as discussed above, couples the bit lines to the sensing means in read mode and to the programming voltage in programming mode, is described in "A 55ns 64k×16 b CMOS EPROM," *ISSCC* 88, pp. 122–23, presented 18 Feb. 1988.

The above biasing method and architecture thus provide for two-sided cell programming and erasure by virtue of a highly resistive region, using a NOR configuration with no alterations to the decoding, load or sensing structures, and so exploiting the vast experience acquired of standard-type flash memories with a high degree of reliability and straightforward design.

More specifically, the slight increase in the area of the array due to the bias transistors (which, in the case of sectors comprising 64 to 256 word lines, is nevertheless on the order of 1%–2%) and in complexity due to the biasing sequence in program mode are more than compensated for by the high degree of reliability afforded by reducing the stresses on the cells.

By virtue of enabling the cells to be programmed with a lower current as compared with standard arrays, the architecture and biasing method according to the present invention are especially advantageous in the case of even low-voltage (3 V) single supply memories.

Clearly, changes may be made to the architecture and method as described and illustrated herein without, however, departing from the scope of the present invention. For example, the invention contemplates both memory arrays having drain-terminal programming and those having source-terminal programming.

Furthermore, provision may be made for one common source line BLS for the whole array, or for a number of source lines, one for each sector or subsector; and the subsectors may be defined in various ways, e.g., like the array portion comprising sixteen bit lines, defined by two common source lines.

We claim:

1. A flash-EEPROM memory array comprising:
   at least one number of memory cells organized in rows and columns and presenting drain regions connected to respective bit lines, source regions connected to a common source line, and control gate regions connected to respective word lines; characterized in that said source and drain regions of said memory cells are asymmetrical; one of said source and drain regions comprising a highly resistive programming portion; and the other of said source and drain regions comprising a portion for erasing said cells; and
   a number of bias switch means, one for each column of said array; said bias switch means presenting a first, a second and a control terminal; said first terminal being connected to a respective bit line; said second terminal being connected to said common source line; and said control terminal being supplied with a control voltage.

2. An array as claimed in claim 1, characterized in that said bias switch means comprise highly conductive MOS transistors.

3. An array as claimed in claim 1, characterized in that, for each said number of cells, said bias switch means are arranged in a row and present control terminals connected to a bias line parallel to said word lines.

4. An array as claimed in claim 1, characterized in that said cells present said highly resistive portion at the drain region connected to a respective bit line.

5. An array as claimed in claim 1, characterized in that said cells present said highly resistive portion at the source region connected to said common source line.

6. A method of biasing a flash-EEPROM memory array comprising at least one number of memory cells organized in rows and columns and having drain regions connected to respective bit lines, source regions connected to a common source line, control gate regions connected to respective word lines, and floating gate regions; said method comprising the steps of programming an addressed cell of said number of cells, and erasing at least one of said number of cells; characterized in that said step of programming an addressed cell comprises the step of generating a write current between said floating gate region and a highly resistive region located at one of said drain and source regions; and said erasing step comprises the step of generating an erase current between said floating gate region and the other of said source and drain regions; said step of programming an addressed cell comprising the step of biasing said common source line and nonaddressed bit lines to a first predetermined voltage value.

7. A method as claimed in claim 6, characterized in that, after said biasing step to said first predetermined voltage value, said step of programming an addressed cell comprises the steps of biasing an addressed word line to a high bias voltage, and then biasing an addressed bit line to a second predetermined voltage value.

8. A method of biasing a flash-EEPROM memory array comprising at least one number of memory cells organized in rows and columns and having drain regions connected to respective bit lines, source regions connected to a common source line, control gate regions connected to respective word lines, and floating gate regions; said method comprising the steps of:
   programming an addressed cell of said number of cells; and
   erasing at least one of said number of cells;
   characterized in that said step of programming an addressed cell comprises the step of generating a write current between said floating gate region and a highly resistive region located at said drain region; and said erasing step comprises the step of generating an erase current between said floating gate region and said source region.

9. A method of biasing a flash-EEPROM memory array comprising at least one number of memory cells organized in rows and columns and having drain regions connected to respective bit lines, source regions connected to a common source line, control gate regions connected to respective word lines, and floating gate regions; said method comprising the steps of:
   programming an addressed cell of said number of cells;
   erasing at least one of said number of cells;
   characterized in that said step of programming an addressed cell comprises the step of generating a write current between said floating gate region and a highly resistive region located at said drain region; and said erasing step comprises the step of generating an erase current between said floating gate region and said source region; and
   during said step of erasing, permitting said drain regions of unaddressed cells to float.

10. A method of biasing a flash-EEPROM memory array comprising at least one number of memory cells organized in rows and columns and having drain regions connected to respective bit lines, source regions connected to a common source line, control gate regions connected to respective word lines, and floating gate regions; said method comprising the steps of programming an addressed cell of said number of cells, and erasing at least one of said number of cells; characterized in that said step of programming an addressed cell comprises the step of generating a write current between said floating gate region and a highly resistive region located at one of said drain and source regions; and said erasing step comprises the step of generating an erase current between said floating gate region and the other of said source and drain regions; said method further comprising the step of reading an addressed cell; characterized in that said read step comprises the step of connecting nonaddressed bit lines to said common source line.

11. A nonvolatile memory, comprising:
a bit line;
a common source line;
a word line;
one or more memory cells each comprising,
a source coupled to said common source line,
a drain asymmetrical with respect to said source and coupled to said bit line,
a control gate coupled to said word line, and
a resistive programming region composing a portion of one of said drain and said source;
a bias line;
a bias switch having a first terminal coupled to said bit line, a second terminal coupled to said common source line, and a control terminal coupled to said bias line.

12. The memory of claim 11 wherein for each of said memory cells said resistive region composes a portion of said source.

13. The memory of claim 11 wherein the bias switch includes a MOS transistor having its gate connected to the bias line.

14. A nonvolatile memory, comprising:
a bit line;
a common source line;
a word line;
one or more memory cells each comprising,
a source coupled to said common source line,
a drain asymmetrical with respect to said source and coupled to said bit line,
a control gate coupled to said word line, and
a resistive programming region composing a portion of one of said drain and said source; wherein for each of said memory cells said resistive region composes a portion of said drain.

15. A method of storing data in a nonvolatile memory having a number of memory cells each including a source coupled to a common source line, a drain asymmetrical with respect to said source and coupled to a bit line, a control gate coupled to a word line, a floating gate, and a resistive programming region composing a portion of one of said drain and said source, said method comprising:
programming an addressed cell by generating a write current between said floating gate and said resistive region of said addressed cell; and
erasing a selected cell by generating an erase current between said floating gate and the one of said drain and source of said selected cell lacking said resistive region;
wherein said programming further comprises biasing said common source line and unaddressed bit lines to a first voltage level.

16. The method of claim 15, further comprising:
biasing an addressed word line to a second voltage level after biasing said common source and unaddressed bit lines; and
biasing an addressed bit line to a third voltage level.

17. The method of claim 15 wherein said programming comprises generating said write current between said drain and said floating gate of hid addressed cell, and wherein said erasing comprises generating said erase current between said floating gate and said source of said selected cell.

18. The method of claim 15 wherein said programming comprises generating said write current between said source and said floating gate of said addressed cell, and wherein said erasing comprises generating said erase current between said floating gate and said drain of said selected cell.

19. The method of claim 15, further comprising reading said addressed cell, wherein said reading comprises coupling unaddressed bit lines to said common source line.

20. The method of claim 15 wherein the step of biasing includes connecting the unaddressed bitlines to the common source line.

21. A method of storing data in a nonvolatile memory having a number of memory cells each including a source coupled to a common source line, a drain asymmetrical with respect to said source and coupled to a bit line, a control gate coupled to a word line, a floating gate, and a resistive programming region composing a portion of said drain, said method comprising:
programming an addressed cell by generating a write current between said floating gate and said resistive region of said addressed cell; and
erasing a selected cell by generating an erase current between said floating gate and the one of said drain and source of said selected cell lacking said resistive region;
wherein said programming comprises generating said write current between said drain and said floating gate of said addressed cell, and wherein said erasing comprises generating said erase current between said floating gate and said source of said selected cell.

22. A method of storing data in a nonvolatile memory having a number of memory cells each including a source coupled to a common source line, a drain asymmetrical with respect to said source and coupled to a bit line, a control gate coupled to a word line, a floating gate, and a resistive programming region composing a portion of said drain, said method comprising:
programming an addressed cell by generating a write current between said floating gate and said drain of said addressed cell; and
erasing a selected cell by generating an erase current between said floating gate and source; and
during the step of erasing, permitting said drains of unaddressed cells to float.

23. A method of storing data in a nonvolatile memory having a number of memory cells each including a source coupled to a common source line, a drain asymmetrical with respect to said source and coupled to a bit line, a control gate coupled to a word line, a floating gate, and a resistive programming region composing a portion of one of said drain and said source, said method comprising:
programming an addressed cell by generating a write current between said floating gate and said resistive region of said addressed cell;
erasing a selected cell by generating an erase current between said floating gate and the one of said drain and source of said selected cell lacking said resistive region; and
reading said addressed cell, wherein said reading comprises coupling unaddressed bit lines to said common source line.

* * * * *

UNITED STATES PATENT AND TRADEMARK OFFICE
CERTIFICATE OF CORRECTION

PATENT NO. : 5,638,327
DATED : June 10, 1997
INVENTOR(S) : Marco Dallabora et al.

It is certified that error appears in the above identified patent and that said Letters Patent is hereby corrected as shown below:

In column 9, claim 17, line 62, please delete "hid" and insert therefor --said--.

Signed and Sealed this

Seventeenth Day of February, 1998

Attest:

BRUCE LEHMAN

*Attesting Officer*           *Commissioner of Patents and Trademarks*